US010244641B2

United States Patent
Seo et al.

(10) Patent No.: US 10,244,641 B2
(45) Date of Patent: Mar. 26, 2019

(54) DISPLAY DEVICE

(71) Applicant: SAMSUNG DISPLAY CO., LTD., Yongin-si, Gyeonggi-do (KR)

(72) Inventors: Jeong Eun Seo, Seoul (KR); Kyoung Tae Kim, Osan-si (KR); Hye-Ryoung Park, Hwaseong-si (KR); Young Jin Lee, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/649,134

(22) Filed: Jul. 13, 2017

(65) Prior Publication Data

US 2018/0020556 A1 Jan. 18, 2018

(30) Foreign Application Priority Data

Jul. 13, 2016 (KR) .................. 10-2016-0088891

(51) Int. Cl.
*G09F 9/30* (2006.01)
*G06F 1/16* (2006.01)
(Continued)

(52) U.S. Cl.
CPC ..... *H05K 5/0017* (2013.01); *G02F 1/133305* (2013.01); *G06F 1/1641* (2013.01);
(Continued)

(58) Field of Classification Search
CPC . G06F 1/1652; G06F 1/133305; G06F 1/1681
See application file for complete search history.

(56) References Cited

U.S. PATENT DOCUMENTS 9,047,055 B2 * 6/2015 Song .................. E05D 3/14
9,164,547 B1 * 10/2015 Kwon ............... G06F 1/1656
(Continued)

FOREIGN PATENT DOCUMENTS

EP 3109847 A1 12/2016
KR 10-2015-0037383 4/2015
(Continued)

OTHER PUBLICATIONS

Extended European Search Report dated Nov. 3, 2017 for European Patent Application No. 17181134.2.

*Primary Examiner* — Xanthia C Cunningham
(74) *Attorney, Agent, or Firm* — F. Chau & Associates, LLC

(57) ABSTRACT

A display device includes a display panel including a bending area that is bendable along an axis extending in a first direction, and a panel support portion that supports the display panel in the bending area. The panel support portion includes a plurality of joint members, a plurality of rotational angle limiting members, and a plurality of connecting members. The joint members are sequentially arranged and support the display panel. Each joint member is rotatable about two rotation axes. The rotational angle limiting members are coupled to the joint members and limit rotational angles of the joint members. Each connecting member is coupled to a pair of the rotational angle limiting members disposed at a pair of adjacent joint members. The rotational angle limiting members included in the pair of rotational angle limiting members contact each other and are fixed to an inner portion of the corresponding connecting member.

28 Claims, 12 Drawing Sheets

(51) Int. Cl.
  *H05K 5/00* (2006.01)
  *H05K 5/02* (2006.01)
  *G02F 1/1333* (2006.01)
(52) U.S. Cl.
  CPC ............ *G06F 1/1652* (2013.01); *G09F 9/301* (2013.01); *H05K 5/0217* (2013.01)

(56) References Cited

U.S. PATENT DOCUMENTS

| | | | |
|---|---|---|---|
| 9,173,287 B1* | 10/2015 | Kim | H05K 1/028 |
| 9,176,535 B2 | 11/2015 | Bohn et al. | |
| 9,471,111 B2* | 10/2016 | Huang | E05D 7/06 |
| 9,562,380 B2* | 2/2017 | Song | |
| 9,625,947 B2* | 4/2017 | Lee | G06F 1/1616 |
| 9,786,207 B2* | 10/2017 | Kim | G09F 9/301 |
| 9,811,119 B2* | 11/2017 | Seo | G06F 1/1652 |
| 9,851,759 B2* | 12/2017 | Tazbaz | G06F 1/1681 |
| 2009/0126155 A1* | 5/2009 | Nieuwenhuizen | H04M 1/0216 16/302 |
| 2012/0307423 A1* | 12/2012 | Bohn | G06F 1/1641 361/679.01 |
| 2014/0126133 A1* | 5/2014 | Griffin | G06F 1/1616 361/679.27 |
| 2014/0196253 A1* | 7/2014 | Song | G06F 1/1601 16/225 |
| 2014/0226275 A1* | 8/2014 | Ko | G06F 1/1626 361/679.27 |
| 2014/0245569 A1* | 9/2014 | Cho | E05D 3/122 16/370 |
| 2015/0055287 A1* | 2/2015 | Seo | G06F 1/1652 361/679.27 |
| 2015/0077917 A1 | 3/2015 | Song | |
| 2015/0131222 A1* | 5/2015 | Kauhaniemi | G06F 1/1652 361/679.27 |
| 2015/0138103 A1* | 5/2015 | Nishi | G02F 1/13452 345/173 |
| 2015/0176317 A1* | 6/2015 | Lee | E05D 3/06 16/251 |
| 2015/0361696 A1* | 12/2015 | Tazbaz | H04M 1/022 361/679.27 |
| 2016/0014919 A1 | 1/2016 | Huitema et al. | |
| 2017/0090523 A1* | 3/2017 | Tazbaz | G06F 1/1681 |
| 2017/0094775 A1* | 3/2017 | Fan | G06F 1/1652 |
| 2017/0303414 A1* | 10/2017 | Chu | H05K 5/0017 |

FOREIGN PATENT DOCUMENTS

| | | |
|---|---|---|
| KR | 1020150099383 | 8/2015 |
| KR | 10-1487189 | 1/2016 |

* cited by examiner

PNL-SU

DISPLAY DEVICE

CROSS-REFERENCE TO RELATED APPLICATIONS

This application claims priority under 35 U.S.C. § 119 to Korean Patent Application No. 10-2016-0088891 filed on Jul. 13, 2016, the disclosure of which is incorporated by reference herein in its entirety.

TECHNICAL FIELD

Exemplary embodiments of the present inventive concept relate to a display device.

DISCUSSION OF THE RELATED ART

Different types of display devices include, for example, a liquid crystal display (LCD), a plasma display panel (PDP), an organic light emitting diode (OLED) display, a field effect display (FED), and an electrophoretic display.

An OLED display includes two electrodes and an organic emission layer interposed therebetween. Electrons injected from one electrode and holes injected from the other electrode are combined in the organic emission layer to generate excitons, and the generated excitons release energy to emit light.

An OLED display may have a reduced thickness and weight since it has a self-luminance characteristic and does not require an additional light source. In addition, an OLED display has high quality characteristics such as low power consumption, high luminance, and high response speed.

Display devices, such as those described above, may be bendable or foldable.

SUMMARY

Exemplary embodiments of the present inventive concept provide a display device that firmly supports a bending area of a display panel.

According to an exemplary embodiment of the inventive concept, a display device includes a display panel including a bending, area that is bendable along an axis extending in a first direction, and a panel support portion that supports the display panel in the bending area. The panel support portion includes a plurality of joint members that support the display panel. The joint members are sequentially arranged, and each joint member is rotatable about two rotation axes. The panel support portion further includes a plurality of rotational angle limiting members coupled to the plurality of joint members. The rotational angle limiting members limit rotational angles of the joint members. The panel support portion further includes a plurality of connecting members. Each connecting member is coupled to a pair of the rotational angle limiting members disposed at a pair of adjacent joint members. The rotational angle limiting members included in the pair of the rotational angle limiting members contact each other and are fixed to an inner portion of the corresponding connecting member.

In an exemplary embodiment, the pair of adjacent joint members includes a first joint member and a second joint member. The first joint member includes a first surface facing the display panel, and a second surface and a third surface that respectively contact opposite end portions of the first surface and face each other along the first direction. Each of a first angle formed by the first surface and the second surface, and a second angle formed by the first surface and the third surface is an acute angle.

In an exemplary embodiment, the first angle and the second angle are about equal to each other.

In an exemplary embodiment, the second joint member includes a fourth surface facing the display panel, and a fifth surface and a sixth surface that respectively contact opposite end portions of the fourth surface and face each other along the first direction. The fifth surface faces the third surface of the first joint member. Each of a third angle formed by the fourth surface and the fifth surface, and a fourth angle formed by the fourth surface and the sixth surface is an acute angle.

In an exemplary embodiment, the third angle and the fourth angle are about equal to each other.

In an exemplary embodiment, the plurality of rotational angle limiting members includes a first rotational angle limiting member and a second rotational angle limiting member respectively coupled to one end portion of each of the first joint member and the second joint member. The first rotational angle limiting member is disposed at a first rotation axis located at a portion where the first surface and the third surface meet. The second rotational angle limiting member is disposed at a second rotation axis located at a portion where the fourth surface and the fifth surface meet.

In an exemplary embodiment, each of cross-sections of the first rotational angle limiting member and the second rotational angle limiting member that are substantially perpendicular to the first direction has a fan shape.

In an exemplary embodiment, the first rotational angle limiting member having the fin shape includes a first radius portion, a second radius portion, and a first arc portion. The first radius portion extends substantially perpendicular to the first surface. The second radius portion extends substantially in a same direction as the third surface. The first arc portion is convex toward the second surface.

In an exemplary embodiment, the first rotation axis is located at a portion where the first radius portion and the second radius portion of the first rotational angle limiting member meet.

In an exemplary embodiment, the second rotational angle limiting member having the fan shape includes a third radius portion, a fourth radius portion, and a second arc portion. The third radius portion faces the first radius portion, and the fourth radius portion faces the second radius portion.

In an exemplary embodiment, the third radius portion extends substantially perpendicular to the fourth surface, the fourth radius portion extends substantially in a same direction as the fifth surface, and the second arc portion is convex toward the sixth surface.

In an exemplary embodiment, the second rotation axis is located at a portion where the third radius portion and the fourth radius portion of the second rotational angle limiting member meet.

In an exemplary embodiment, the first rotation axis and the second rotation axis overlap each other.

In an exemplary embodiment, each of the plurality of connecting members has a ring shape.

In an exemplary embodiment, an inner circumferential surface of one of the connecting members contacts the first arc portion of the first rotational angle limiting member and the second arc portion of the second rotational angle limiting member.

In an exemplary embodiment, the first rotational angle limiting member having the fan shape includes a first radius portion, a second radius portion, and a first arc portion. The first radius portion and the first surface form an acute angle, the second radius portion extends substantially perpendicular to the first surface, and the first arc portion is convex toward the second surface.

In an exemplary embodiment, the first rotation axis is located at a portion where the first radius portion and the second radius portion of the first rotational angle limiting member meet.

In an exemplary embodiment, the second rotational angle limiting member having the fan shape includes a third radius portion, a fourth radius portion, and a second arc portion. The third radius portion faces the first radius portion, and the fourth radius portion faces the second radius portion.

In an exemplary embodiment, the third radius portion and the fourth surface form an acute angle, the fourth radius portion extends substantially perpendicular to the fourth surface, and the second arc portion is convex toward the sixth surface.

In an exemplary embodiment, the second rotation axis is located at a portion where the third radius portion and the fourth radius portion of the second rotational angle limiting member meet.

In an exemplary embodiment, the display device further includes a spacer disposed in the third surface of the first joint member. The spacer presses against the fifth surface of the second joint member.

In an exemplary embodiment, the spacer includes an elastic member disposed in a groove formed in the third surface.

In an exemplary embodiment, the spacer includes a protrusion member coupled to an end portion of the elastic member.

In an exemplary embodiment, the display device further includes a plurality of spacers.

In an exemplary embodiment, the display device further includes a first support plate coupled to a first side of the panel support portion. The display panel includes a first flat area disposed at a first side of the bending area, and the first support plate supports the display panel in the first flat area.

In an exemplary embodiment, the display device further includes a second support plate coupled to a second side of the panel support portion opposite the first side of the panel support portion. The display panel includes a second flat area disposed at a second side of the bending area opposite the first side of the bending area, and the second support plate supports the display panel in the second flat area.

According to an exemplary embodiment of the inventive concept, a display device includes a display panel including a bending area, and a panel support portion that supports the display panel in the bending area. The panel support portion includes a first joint member and a second joint member that support the display panel. Each of the first and second joint members is rotatable about two rotation axes. The panel support portion further includes a first fan-shaped rotational angle limiting member coupled to a first end portion of the first joint member, and a second fan-shaped rotational angle limiting member coupled to a first end portion of the second joint member. The first end portion of the first joint member is adjacent to the first end portion of the second joint member. The panel support portion further includes a first connecting member coupled to the first fan-shaped rotational angle limiting member and the second fan-shaped rotational angle limiting member. The first and second fan-shaped rotational angle limiting members contact each other and are fixed to an inner portion of the first connecting member.

In an exemplary embodiment, the panel support portion further includes a third fan-shaped rotational angle limiting member coupled to a second end portion of the first joint member. The first end portion of the first joint member is opposite the second end portion of the first joint member. The panel support portion further includes a fourth fan-shaped rotational angle limiting member coupled to a second end portion of the second joint member. The first end portion of the second joint member is opposite the second end portion of the second joint member, and the second end portion of the first joint member is adjacent to the second end portion of the second joint member. The panel support portion further includes a second connecting member coupled to the third fan-shaped rotational angle limiting member and the fourth fan-shaped rotational angle limiting member. The third and fourth fan-shaped rotational angle limiting members contact each other and are fixed to an inner portion of the second connecting member.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
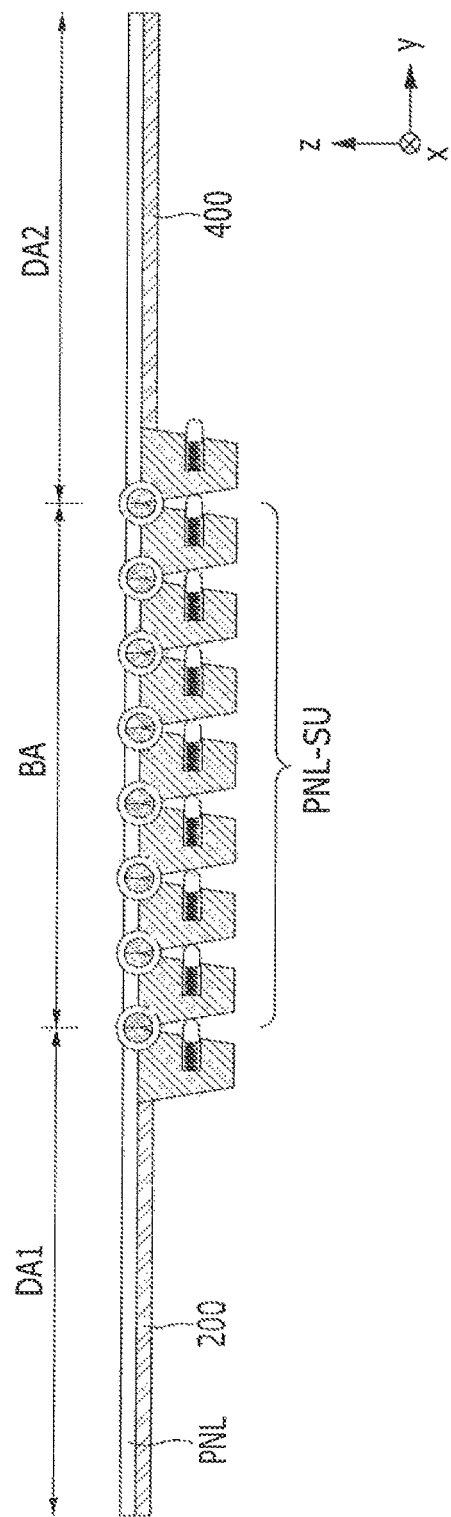
FIG. 1 illustrates a schematic view of an unfolded state of a display device according to an exemplary embodiment of the inventive concept.

Exemplary embodiments of the present inventive concept will be described more fully hereinafter with reference to the accompanying drawings. Like reference numerals may refer to like elements throughout the accompanying drawings.

In the drawings, the thickness of layers, films, panels, regions, etc., may be exaggerated for clarity.

Spatially relative terms, such as "beneath", "below". "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component is referred to as being "on", "connected to", "coupled to", or "adjacent to" another component, it can be directly on, connected to, coupled to, or adjacent to the other component, or intervening components may also be present. It will also be understood that when a component is referred to as being "between" two components, it can be the only component between the two components, or one or more intervening components may also be present.

It will further be understood that the terms "first," "second," "third," etc. are used herein to distinguish one element from another, and the elements are not limited by these terms. Thus, a "first" element in an exemplary embodiment may be described as a "second" element in another exemplary embodiment.

Herein, when a component or surface is described as being substantially flat, it is to be understood that the surface is exactly flat, or almost flat (e.g., within a measurement error), as would be understood by a person having ordinary skill in the art. Further, when one value is described as being about the same as or about equal to another value, it is to be understood that the values are equal to each other to within a measurement error, or if measurably unequal, are close enough in value to be functionally equal to each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other as would be understood by a person having ordinary skill in the art. Similarly, when two components are described as extending in the same direction, the two components extend in exactly the same direction, or extend approximately in the same direction as would be understood by a person having ordinary skill in the art.

Hereinafter, a display device according to an exemplary embodiment of the inventive concept will be described with reference to FIGS. 1 and 2.

FIG. 1 illustrates a schematic view of an unfolded state of a display device according to an exemplary embodiment of the inventive concept. FIG. 2 illustrates a schematic view of a folded state of the display device of FIG. 1 according to an exemplary embodiment of the inventive concept.

Figure 2:
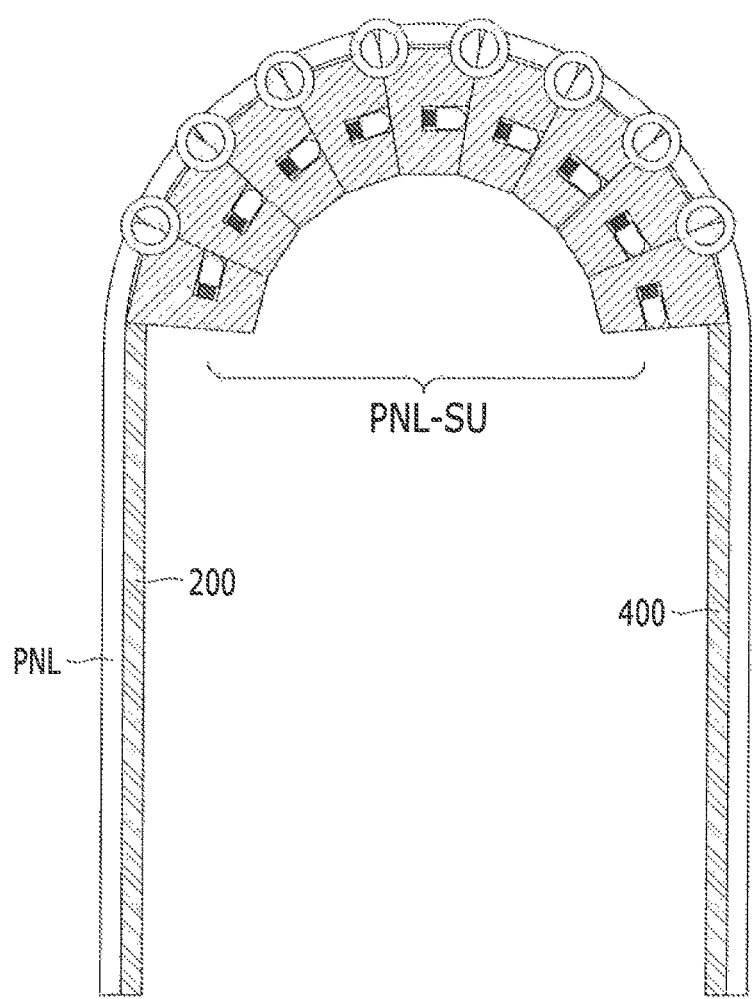
FIG. 2 illustrates a schematic view of a folded state of the display device of FIG. 1 according to an exemplary embodiment of the inventive concept.

Referring to FIGS. 1 and 2, a display device according to an exemplary embodiment includes a display panel (PNL), a first support plate 200, a second support plate 400, and a panel support portion (PNL-SU). In an exemplary embodiment, the panel support portion (PNL-SU) supports a bending area BA of the display panel (PNL). Herein, when a first component, such as the panel support portion (PNL-SU), is described as supporting a second component, such as the bending area BA of the display panel (PNL), it is to be understood that the first component provides structural support to the second component. The panel support portion (PNL-SU) includes a plurality of joint members 110 and 130 (refer to FIGS. 3 and 5). In an exemplary embodiment, the plurality of joint members 110 and 130 have the same shape. The plurality of joint members 110 and 130 allow for the bending area BA of the display panel (PNL) to be firmly supported when the display device is unfolded or folded.

The display panel (PNL) emits light to display an image. The display panel (PNL) is not limited to use in a particular type of display. For example, the display panel (PNL) may be a display panel used in, for example, an organic light emitting diode (OLED) display, a liquid crystal display (LCD), a plasma display, a field emission display (FED), an electrophoretic display, etc.

In an exemplary embodiment, the display panel (PNL) is divided into a first flat area DA1, a second flat area DA2, and the bending area BA. Each of the first flat area DA1, the second flat area DA2, and the bending area BA includes a plurality of pixels disposed thereon, and thus, each of the areas includes a display area in which an image is displayed.

Unlike the bending area BA, the first flat area DA1 and the second flat area DA2 correspond to areas in which the display panel (PNL) is kept flat. That is, the first flat area DA1 and the second flat area DA2 do not bend. The bending area BA corresponds to an area in which the display panel (PNL) may be repeatedly bent, folded, and unfolded. In an exemplary embodiment, the first flat area DA1 and the second flat area DA2 are disposed at opposite sides of the bending area BA. For example, the first flat area DA1, the bending area BA, and the second flat area DA2 may be sequentially disposed, as shown in FIG. 1.

In an exemplary embodiment, the first support plate 200 is coupled to one side of the panel support portion (PNL-SU). The first support plate 200 supports the first flat area DA1 of the display panel (PNL). The first support plate 200 provides structural support to the display panel (PNL) in the first flat area DA1, resulting in the display panel (PNL) in the first flat area DA1 remaining substantially flat.

The first support plate 200 may have a plate shape. An upper surface of the first support plate 200 facing the display panel (PNL) may be substantially flat. As a result, the first support plate 200 may prevent the corresponding surface of the display panel (PNL) from being uneven.

The first support plate 200 may be formed to have a shape corresponding to the first flat area DA1 of the display panel (PNL). For example, the first support plate 200 may be formed to have a quadrangular shape. In this case, an area of the first support plate 200 may be substantially the same as or greater than that of the display panel (PNL) in the first flat area DA1.

In an exemplary embodiment, the second support plate 400 is coupled to the other side of the panel support portion (PNL-SU) (e.g., to the opposite side of the panel support portion (PNL-SU) that the first support plate 200 is coupled to). The second support plate 400 supports the second flat area DA2 of the display panel (PNL). The second support plate 400 provides structural support to the display panel (PNL) in the second flat area. DA2, resulting in the display panel (PNL) in the second flat area DA2 remaining substantially flat.

The second support plate 400 may have a plate shape. Similar to the first support plate 200, an upper surface of the second support plate 400 facing the display panel (PNL) may be substantially flat. As a result, the second support plate 400 may prevent the corresponding surface of the display panel (PNL) from being uneven.

The second support plate 400 may be formed to have a shape corresponding to the second flat area DA2 of the display panel (PNL). For example, the second support plate 400 may be formed to have a quadrangular shape. In this case, an area of the second support plate 400 may be substantially the same as or greater than that of the display panel (PNL) in the second flat area DA2.

Referring to FIG. 2, when the panel support portion (PNL-SU) is bent, the first support plate 200 and the second support plate 400 positioned at opposite sides of the panel support portion (PNL-SU) are disposed to face each other. Thus, while the first support plate 200 and the second support plate 400 face each other, the display device maintains a folded state. The display panel (PNL) may display an image while the display device is in the folded state.

Hereinafter, a configuration of the panel support portion (PNL-SU) according to an exemplary embodiment of the inventive concept will be described in detail with reference to FIGS. 3 to 7.

Figure 3:
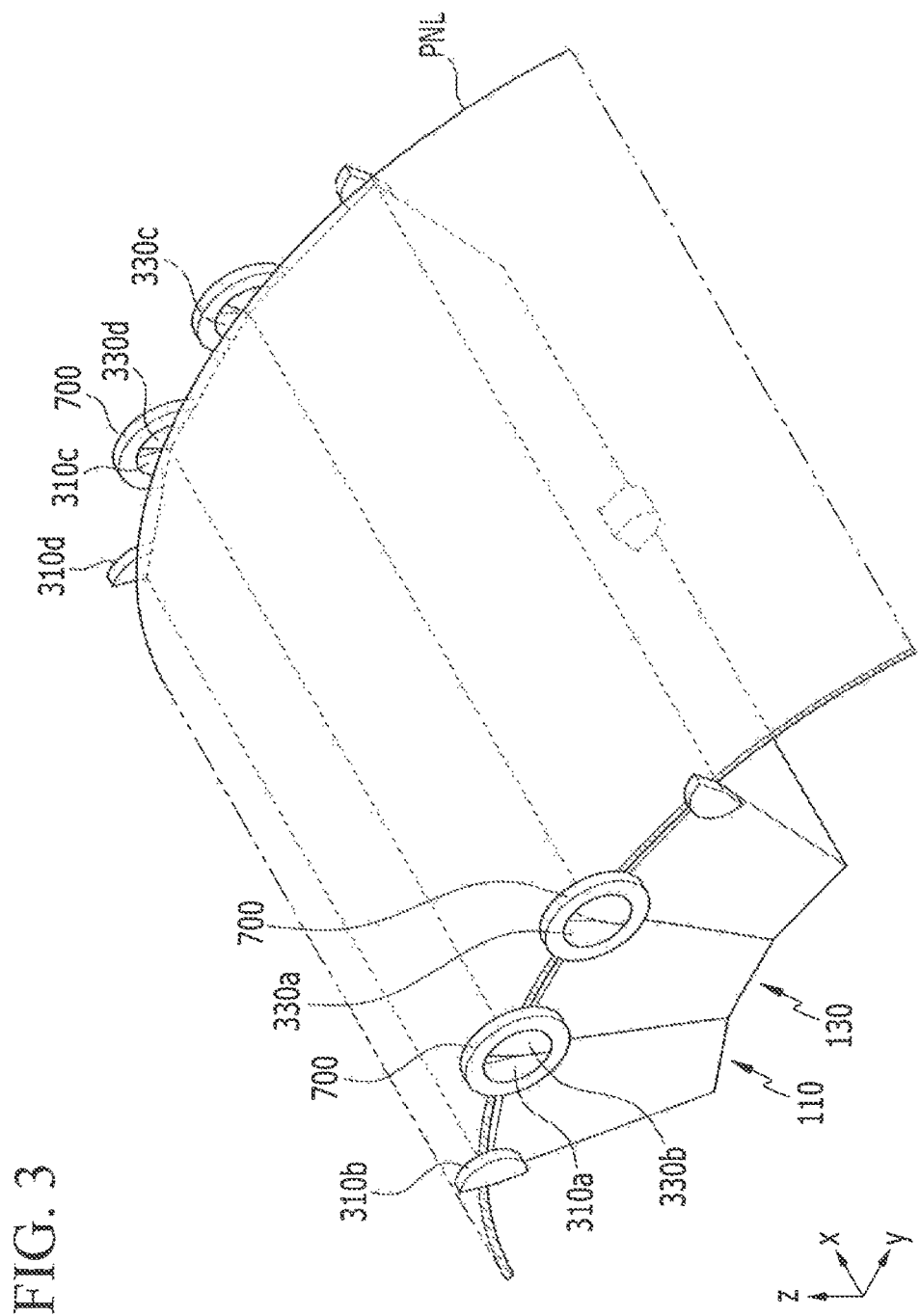
FIG. 3 illustrates a schematic view of a panel support portion of FIG. 2 and a portion of a display panel according to an exemplary embodiment of the inventive concept.
Figure 4:
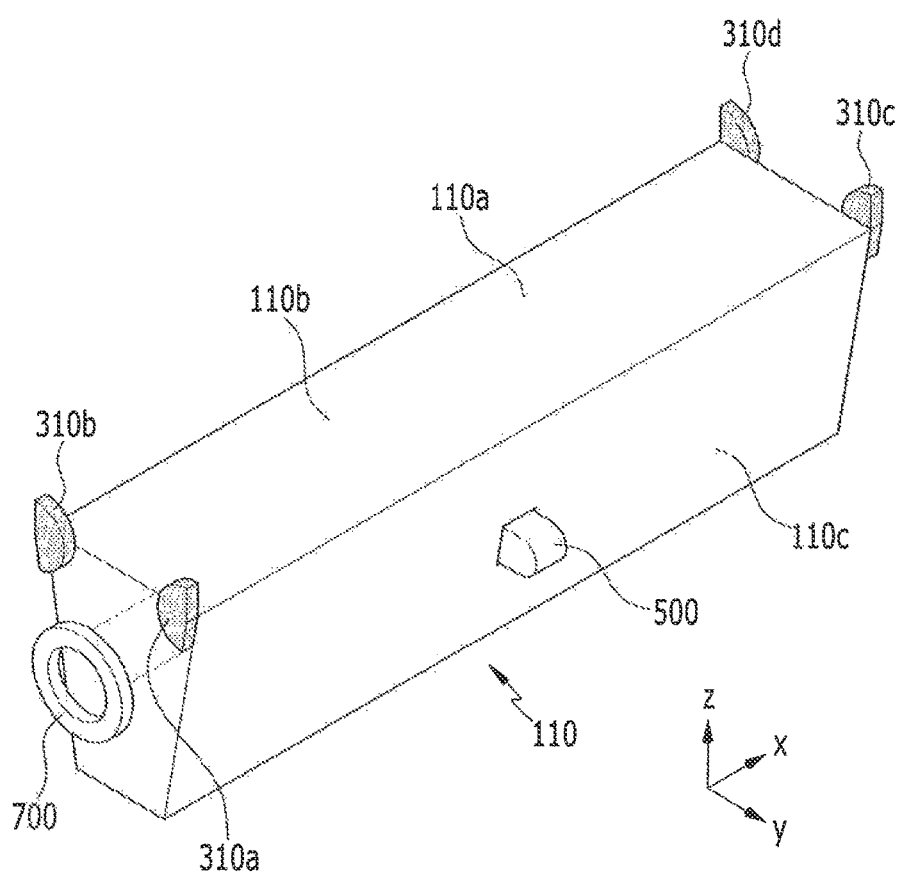
FIG. 4 schematically illustrates a perspective view of a single unit forming a panel support portion according to an exemplary embodiment of the inventive concept.
Figure 5:
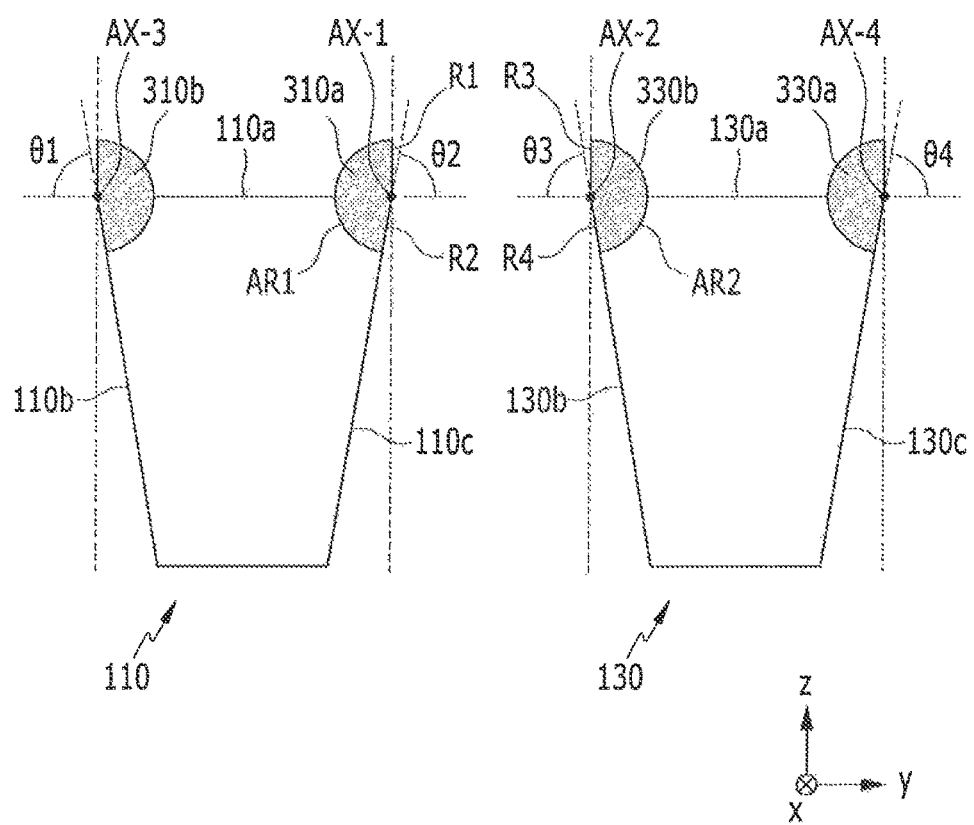
FIG. 5 illustrates a schematic view showing a relationship of a first joint member and a second joint member according to an exemplary embodiment of the inventive concept.
Figure 6:
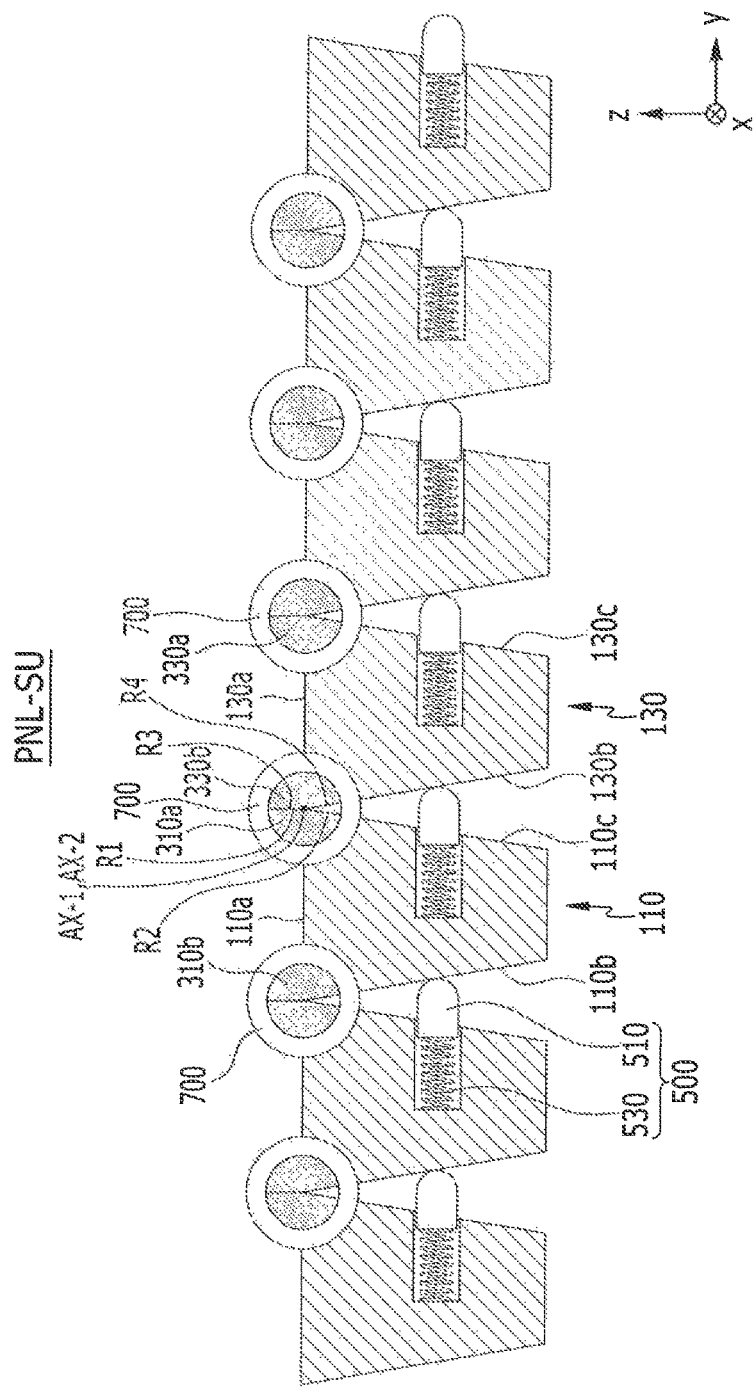
FIG. 6 illustrates a schematic view of an unfolded state of a panel support portion according to an exemplary embodiment of the inventive concept.
Figure 7:
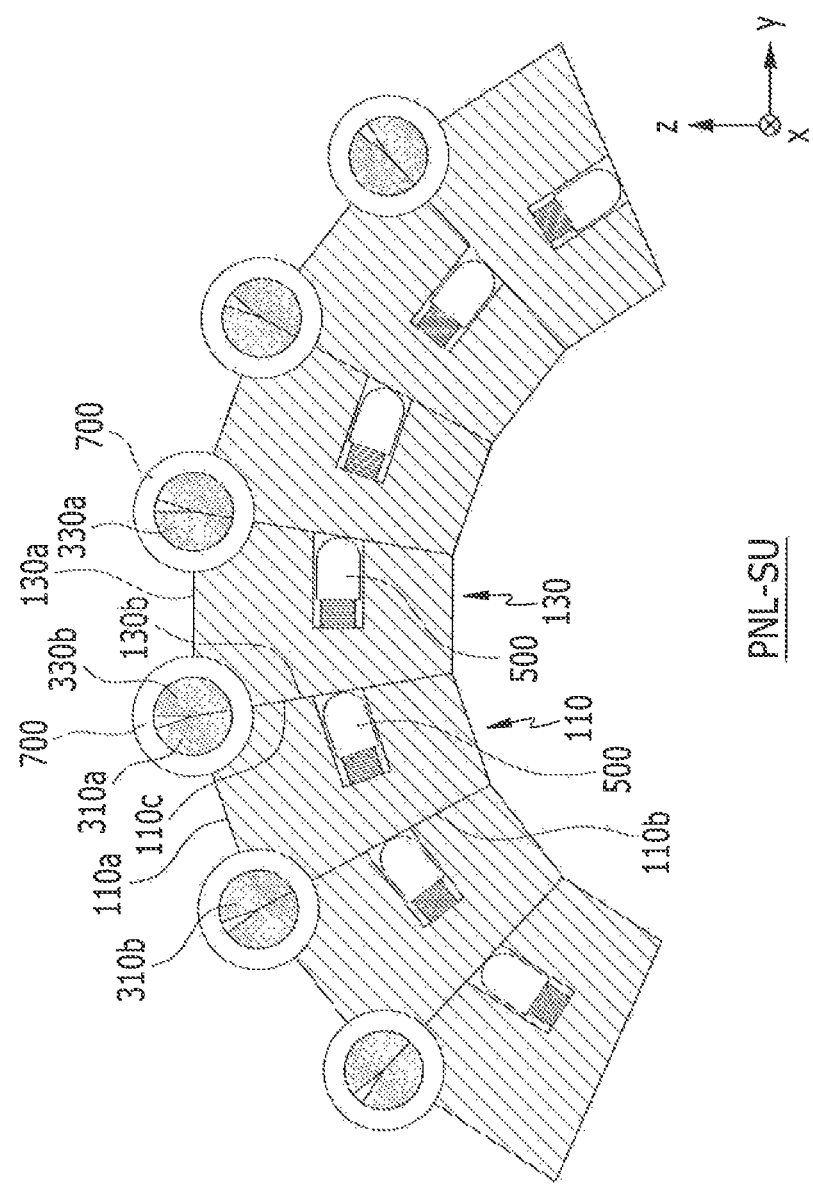
FIG. 7 illustrates a schematic view of a bent state of the panel support portion of FIG. 6 according to an exemplary embodiment of the inventive concept.

FIG. 3 illustrates a schematic view of the panel support portion of FIG. 2 and a portion of the display panel according to an exemplary embodiment of the inventive concept. FIG. 4 schematically illustrates a perspective view of a single unit forming the panel support portion according to an exemplary embodiment of the inventive concept. FIG. 5 illustrates a schematic view showing a relationship of a first joint member and a second joint member according to an exemplary embodiment of the inventive concept. FIG. 6 illustrates a schematic view of an unfolded state of the panel support portion according to an exemplary embodiment of the inventive concept. FIG. 7 illustrates a schematic view of a bent state of the panel support portion of FIG. 6 according to an exemplary embodiment of the inventive concept.

Referring to FIGS. 3 and 4, in an exemplary embodiment, the panel support portion (PNL-SU) supports the display panel (PNL) in the bending area BA. In an exemplary embodiment, the panel support portion (PNL-SU) includes a plurality of joint members 110 and 130, a plurality of rotational angle limiting members 310a, 310b, 310c, 310d, 330a, 330b, 330c, and 330d, and a plurality of connecting members 700.

The plurality of joint members 110 and 130 contact the display panel (PNL) and support the display panel (PNL). The plurality of joint members 110 and 130 may be sequentially arranged along a second direction. Herein, in the accompanying drawings, an x-axis represents a first direction, a y-axis represents the second direction, and a z-axis represents a third direction.

The plurality of joint members 110 and 130 may have substantially the same shape, and may be disposed at predetermined intervals along the second direction.

The plurality of joint members 110 and 130 will now be described in detail with reference to FIGS. 4 and 5. The first joint member 110 of the plurality of joint members 110 and 130 has a bar shape extending along the first direction. The first direction corresponds to a central axis of the display panel (PNL) when the display panel (PNL) is bent (refer to FIG. 3). For example, the first direction refers to the direction in which the central axis of the display panel (PNL) extends when the display panel (PNL) is bent (e.g., the x direction in FIG. 3).

A cross-sectional shape of the first joint member 110 may be a trapezoid. The cross-section of the first joint member 110 corresponds to a cross-section of the first joint member 110 taken along a y-z plane.

The first joint member 110 may include a first surface 110a, a second surface 110b, and a third surface 110c. The first surface 110a faces the display panel (PNL), and corresponds to an upper side of the trapezoid shaped cross-section of the first joint member 110.

The second surface 110b and the third surface 110c contact and extend from opposite end portions of the first surface 110a, respectively. The second surface 110b and the third surface 110c are disposed to face each other along the first direction. A first angle ($\theta 1$) formed by the first surface 110a and the second surface 110b may be substantially the same as a second angle ($\theta 2$) formed by the first surface 110a and the third surface 110c. In an exemplary embodiment, the first angle ($\theta 1$) and the second angle ($\theta 2$) may each be an acute angle.

The second joint member 130 of the plurality of joint members 110 and 130 has substantially the same shape as the first joint member 110 according to exemplary embodiments. For example, the second joint member 130 may also have a bar shape extending along the first direction.

Similar to the first joint member 110, a cross-sectional shape of the second joint member 130 may be a trapezoid. The cross-section of the second joint member 130 corresponds to a cross-section of the second joint member 130 taken along the third direction.

The second joint member 130 may include a fourth surface 130a, a fifth surface 130b, and a sixth surface 130c. The fourth surface 130a faces the display panel (PNL) and corresponds to an upper side of the trapezoid shaped cross-section of the second joint member 130.

The fifth surface 130b and the sixth surface 130c contact and extend from opposite end portions of the fourth surface 130a, respectively. The fifth surface 130b and the sixth surface 130c are disposed to face each other along the first direction. A third angle ($\theta 3$) formed by the fourth surface 130a and the fifth surface 130b may be substantially the same as a fourth angle ($\theta 4$) formed by the fourth surface 130a and the sixth surface 130c. In an exemplary embodiment, the third angle ($\theta 3$) and the fourth angle ($\theta 4$) may each be an acute angle. The third angle ($\theta 3$) and the fourth angle ($\theta 4$) may be substantially the same as the first angle ($\theta 1$) and the second angle ($\theta 2$) of the first joint member 110.

In an exemplary embodiment, by adjusting the first angle ($\theta 1$) and the second angle ($\theta 2$) of the first joint member 110 or the third angle ($\theta 3$) and the fourth angle ($\theta 4$) of the second joint member 130, the number of the plurality of joint members 110 and 130 of the panel support portion (PNL-SU) may be adjusted. In addition, by adjusting the angles, a curvature radius of the panel support portion (PNL-SU) may be adjusted when the panel support portion (PNL-SU) is bent.

For example, while the panel support portion (PNL-SU) is bent so that the first support plate 200 and the second support plate 400 face each other (e.g., are substantially parallel to each other), as the angle decreases, the curvature radius of the panel support portion (PNL-SU) may decrease. When the curvature radius of the panel support portion (PNL-SU) decreases, the number of the plurality of joint members 110 and 130 of the panel support portion (PNL-SU) may decrease. In contrast, when the angle increases, the curvature radius of the panel support portion (PNL-SU) increases, and the number of the plurality of joint members 110 and 130 of the panel support portion (PNL-SU) may increase.

The first joint member 110 may rotate about a first rotation axis AX-1 or a third rotation axis AX-3. As shown in FIG. 5, in an exemplary embodiment, the first surface 110a and the third surface 110c of the first joint member 110 meet at the first rotation axis AX-1. For example, in an exemplary embodiment, the first surface 110a and the third surface 110c of the first joint member 110 form a corner at the first rotation axis AX-1. Similarly, in an exemplary embodiment, the first surface 110a and the second surface 110b of the first joint member 110 meet at the third rotation axis AX-3. For example, in an exemplary embodiment, the first surface 110a and the second surface 110b of the first joint member 110 form a corner at the third rotation axis AX-3.

The second joint member 130 may rotate about a second rotation axis AX-2 or a fourth rotation axis AX-4. As shown in FIG. 5, in an exemplary embodiment, the fourth surface 130a and the fifth surface 130b of the second joint member 130 meet at the second rotation axis AX-2. For example, in an exemplary embodiment, the fourth surface 130a and the fifth surface 130b of the second joint member 130 form a corner at the second rotation axis AX-2. Similarly, in an exemplary embodiment, the fourth surface 130a and the sixth surface 130c of the second joint member 130 meet at the fourth rotation axis AX-4. For example, in an exemplary embodiment, the fourth surface 130a and the sixth surface 130c of the second joint member 130 form a corner at the fourth rotation axis AX-4.

In an exemplary embodiment, the first rotation axis AX-1 of the first joint member 110 and the second rotation axis AX-2 of the second joint member 130 overlap each other. For example, in an exemplary embodiment, the first rotation axis AX-1 and the second rotation axis AX-2 are the same rotation axis.

In an exemplary embodiment, the rotational angle limiting members 310a and 330b may be coupled to each of the plurality of joint members 110 and 130. The plurality of rotational angle limiting members 310a and 330b may respectively limit rotational angles of the plurality of joint members 110 and 130. For example, the plurality of rotational angle limiting members 310a and 330b may limit the coupled joint members 110 and 130 to rotate only in a predetermined direction, as described further below.

The rotational angle limiting members 310a, 310b, 310c, and 310d may be coupled to the first joint member 110, as shown in FIG. 3. The rotational angle limiting members 310a, 310b, 310c, and 310d may be disposed at opposite end portions of the first joint member 110 along the first direction.

In an exemplary embodiment, the rotational angle limiting members 310a and 310c are disposed at the first rotation axis AX-1. For example, in an exemplary embodiment, the rotational angle limiting members 310a and 310c are disposed at opposite ends of the corner formed where the first surface 110a and the third surface 110c of the first joint member 110 meet.

In an exemplary embodiment, the rotational angle limiting members 310b and 310d are disposed at the third rotation axis AX-3. For example, in an exemplary embodiment, the rotational angle limiting members 310b and 310d are disposed at opposite ends of the corner formed where the first surface 110a and the second surface 110b of the first joint member 110 meet.

The rotational angle limiting members 330a, 330b, 330c, and 330d may be coupled to the second joint member 130, as shown in FIG. 3. The rotational angle limiting members 330a, 330b, 330c, and 330d may be disposed at opposite end portions of the second joint member 130 along the first direction.

In an exemplary embodiment, the rotational angle limiting members 330a and 330c are disposed at the fourth rotation axis AX-4. For example, in an exemplary embodiment, the rotational angle limiting members 330a and 330c are disposed at opposite ends of the corner formed where the fourth surface 130a and the sixth surface 130c of the second joint member 130 meet.

In an exemplary embodiment, the rotational angle limiting members 330b and 330d are disposed at the second rotation axis AX-2. For example, in an exemplary embodiment, the rotational angle limiting members 330b and 330d are disposed at opposite ends of the corner formed where the fourth surface 130a and the fifth surface 130b of the second joint member 130 meet.

Cross-sections taken along the third direction of the rotational angle limiting members 310a, 310b, 310c, and 310d coupled to the first joint member 110 may have a fan shape. For example, in an exemplary embodiment, each of cross-sections of the rotational angle limiting members 310a, 310b, 310c, and 310d that are substantially perpendicular to the first direction have a fan shape.

For example, referring to FIG. 5, in an exemplary embodiment, the first rotational angle limiting member 310a is disposed at the first rotation axis AX-1 of the first joint member 110. The first rotational angle limiting member 310a has a fan shape formed by a first radius portion R1, a second radius portion R2, and a first arc portion AR1 of the first rotational angle limiting member 310a. The first arc portion AR1 corresponds to an arc of a fan shape.

As shown in FIG. 5, in an exemplary embodiment, the first radius portion R1 extends substantially perpendicular to the first surface 110a, and the second radius portion R2 extends in substantially the same direction as the third surface 110c. The first arc portion AR1 is convex toward the second surface 110b. For example, the first arc portion AR1 of the first rotational angle limiting member 310a is not convex toward the second rotational angle limiting member 330b which faces the first rotational angle limiting member 310a, but rather, is convex toward the second surface 110b of the first joint member 110. The first rotation axis AX-1 is located at a portion where the first radius portion R1 and the second radius portion R2 meet (e.g., the first rotation axis AX-1 passes through this point).

Referring to FIG. 5, in an exemplary embodiment, the second rotational angle limiting member 330b is disposed at the second rotation axis AX-2 of the second joint member 130. The second rotational angle limiting member 330b has a fan shape formed by a third radius portion R3, a fourth radius portion R4, and a second arc portion AR2 of the second rotational angle limiting member 330b. The second arc portion AR2 corresponds to an arc of a fan shape.

As shown in FIG. 5, in an exemplary embodiment, the third radius portion R3 extends substantially perpendicular to the fourth surface 130a of the second joint member 130, and the fourth radius portion R4 extends in substantially the same direction as the fifth surface 130b. The second arc portion AR2 is convex toward the sixth surface 130c. For example, the second arc portion AR2 of the second rotational angle limiting member 330b is not convex toward the first rotational angle limiting member 310a which faces the second rotational angle limiting member 330b, but rather, is convex toward the sixth surface 130c of the second joint member 130. The second rotation axis AX-2 is located at a portion where the third radius portion R3 and the fourth radius portion R4 meet (e.g., the second rotation axis AX-2 passes through this point).

In an exemplary embodiment, the third radius portion R3 of the second rotational angle limiting member 330b faces the first radius portion R1 of the first rotational angle limiting member 310a, and the fourth radius portion R4 of the second rotational angle limiting member 330b faces the second radius portion R2 of the first rotational angle limiting member 310a.

Referring again to FIG. 3, in an exemplary embodiment, a connecting member 700 is coupled to the first rotational angle limiting member 310a and the second rotational angle limiting member 330b. In an exemplary embodiment, the connecting member 700 has a ring shape. The first arc portion AR1 (refer to FIG. 5) of the first rotational angle limiting member 310a and the second arc portion AR2 (refer to FIG. 5) of the second rotational angle limiting member 330b, which respectively have the fan shape, contact an inner circumferential surface of the connecting member 700 having the ring shape. For example, in an exemplary embodiment, the connecting member 700 surrounds the first rotational angle limiting member 310a and the second rotational angle limiting member 330b, and the first rotational angle limiting member 310a and the second rotational angle limiting member 330b are fixed to an inner portion of the connecting member 700.

The first arc portion AR1 of the first rotational angle limiting, member 310a, which contacts a portion of the inner circumferential surface of the connecting member 700, may rotate about the first rotation axis AX-1 (refer to FIG. 5). The second arc portion AR2 of the second rotational angle limiting member 330b, which contacts another portion of the inner circumferential surface of the connecting member 700, may rotate about the second rotation axis AX-2 (refer to FIG. 5).

In an exemplary embodiment, since the first rotation axis AX-1 and the second rotation axis AX-2 overlap each other, the first arc portion AR1 of the first rotational angle limiting member 310a and the second arc portion AR2 of the second rotational angle limiting member 330b may rotate about the same rotation axis AX-1 and AX-2 along the inner circumferential surface of the ring-shaped connecting member 700.

In an exemplary embodiment, the first radius portion R1 (refer to FIG. 5) of the first rotational angle limiting member 310a and the third radius portion R3 (refer to FIG. 5) of the second rotational angle limiting member 330b face each other, and the first radius portion R1 and the third radius portion R3 are respectively substantially perpendicular to the first surface 110a (refer to FIG. 5) and the fourth surface 130a (refer to FIG. 5). As a result, according to exemplary embodiments, the rotational directions of the first rotational angle limiting member 310a and second rotational angle limiting member 330b (e.g., the rotational angles thereof) are limited.

Referring to FIG. 5, in an exemplary embodiment, because of the presence of the third radius portion R3 of the second rotational angle limiting member 330b, the first radius portion R1 of the first rotational angle limiting member 310a is prevented from rotating in a clockwise direction about the x-axis. For example, as shown in FIG. 5, in an exemplary embodiment, the first radius portion R1 of the first rotational angle limiting member 310a may rotate in a counterclockwise direction about the x-axis, but does not rotate in the clockwise direction.

Similarly, in an exemplary embodiment, because of the presence of the first radius portion R1 of the first rotational angle limiting member 310a, the third radius portion R3 of the second rotational angle limiting member 330b is prevented from rotating in the counterclockwise direction about the x-axis. For example, as shown in FIG. 5, in an exemplary embodiment, the third radius portion R3 of the second rotational angle limiting member 330b may rotate in the clockwise direction about the x-axis, but does not rotate in the counterclockwise direction.

Referring to FIG. 6, the first joint member 110 may rotate in the counterclockwise direction about the first rotation axis AX-1 and the second rotation axis AX-2 via the first rotational angle limiting member 310a and the second rotational angle limiting member 330b. The second joint member 130 may rotate in the clock vise direction about the first rotation axis AX-1 and the second rotation axis AX-2 via the first rotational angle limiting member 310a and the second rotational angle limiting member 330b.

For example, as shown in FIG. 7, in an exemplary embodiment, the first surface 110a of the first joint member 110 and the fourth surface 130a of the second joint member 130 are disposed to have a shape that is convexly bent along the z-axis. As a result of the shape of the first rotational angle limiting member 310a of the first joint member 110 and the shape of the second rotational angle limiting member 330b of the second joint member 130, the display panel (PNL) disposed on the panel support portion (PNL-SU) may be convexly bent along the z-axis in only one direction according to exemplary embodiments.

Referring to FIGS. 6 and 7, in an exemplary embodiment, a spacer 500 is disposed in each of the third surface 110c of the first joint member 110 and the sixth surface 130c of the second joint member 130. For example, the spacer 500 of the first joint member 110 maintains a distance between the third surface 110c of the first joint member 110 and the fifth surface 130b of the second joint member 130 such that the distance is constant. A plurality of spacers 500 may be provided in the panel support portion (PNL-SU).

In an exemplary embodiment, the spacer 500 may include an elastic member 530 and a protrusion member 510. The elastic member 530 may be inserted into and fixed within a groove formed in the third surface 1100 of the first joint member 110. The elastic member 530 may be, for example, a spring. The protrusion member 510 is coupled to an end of the elastic member 530, and contacts the fifth surface 130b of the second joint member 130. However, the spacer 500 is not limited thereto. For example, in an exemplary embodiment, the spacer 500 may include only the elastic member 530. For example, the elastic member 530 may directly contact the fifth surface 130b of the second joint member 130.

In an exemplary embodiment, the protrusion member 510 may contact and press against the fifth surface 130b of the second joint member 130 due to the elastic member 530 of the spacer 500. Accordingly, when an external force is not applied to the first joint member 110 and the second joint member 130, the first surface 110a of the first joint member 110 and the fourth surface 130a of the second joint member 130 may be substantially aligned in a plane on which the x-axis and the y-axis are formed. For example, the first surface 110a of the first joint member 110 and the fourth surface 130a of the second joint member 130 may form a plane, and the display panel (PNL) placed on the first surface 110a and the fourth surface 130a may be maintained substantially flat.

Referring to FIG. 7, in an exemplary embodiment, when an external force is applied to the first joint member 110 and the second joint member 130, the fifth surface 130b of the second joint member 130 presses against the protrusion member 510 of the spacer 500. As a result, the protrusion member 510 enters the groove formed in the third surface 110c of the first joint member 110.

Hereinafter, a display device according to an exemplary embodiment of the inventive concept will be described with reference to FIGS. 8 and 9. For convenience of explanation, a further description of components previously described may be omitted.

Figure 8:
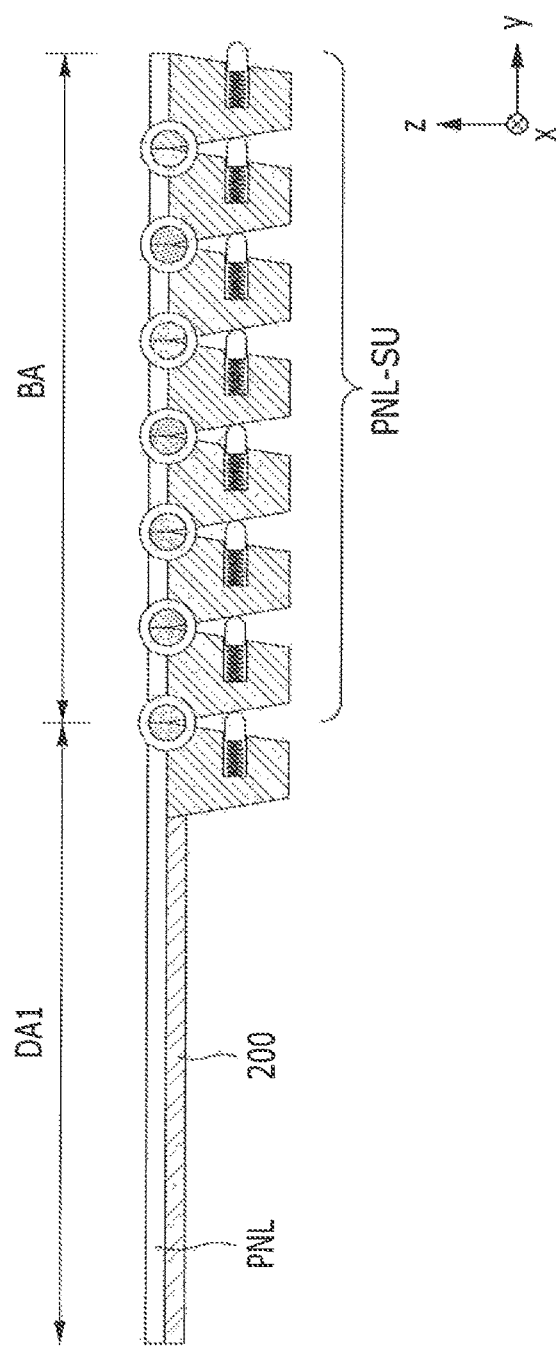
FIG. 8 illustrates a schematic view of an unfolded state of a display device according to an exemplary embodiment of the inventive concept.

FIG. 8 illustrates a schematic view of an unfolded state of a display device according to an exemplary embodiment of the inventive concept. FIG. 9 illustrates a schematic view of a bent state of the display device of FIG. 8 according to an exemplary embodiment of the inventive concept.

Figure 9:
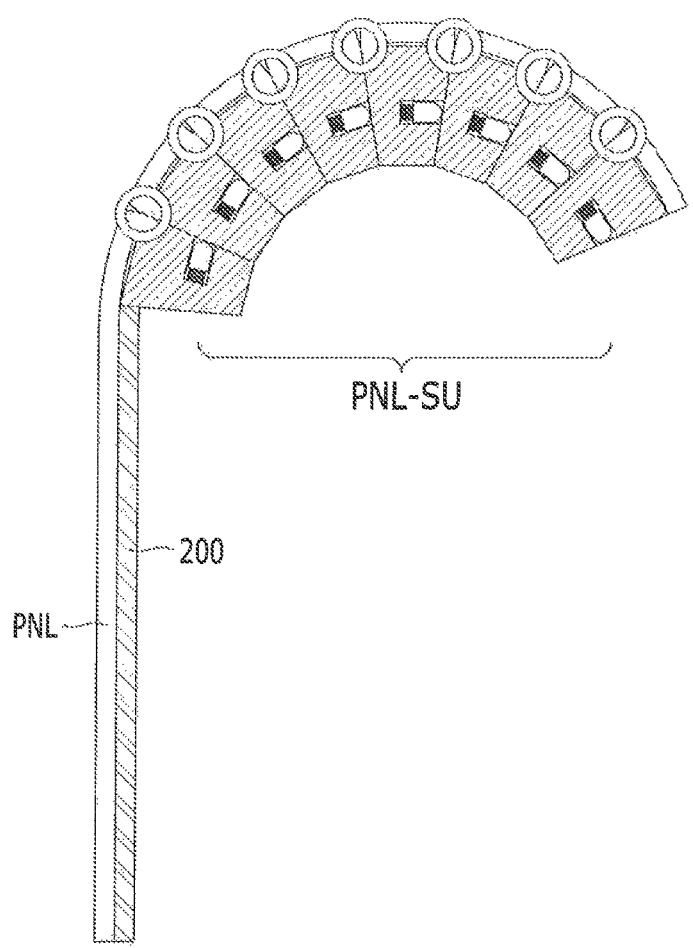
FIG. 9 illustrates a schematic view of a bent state of the display device of FIG. 8 according to an exemplary embodiment of the inventive concept.

Referring to FIGS. 8 and 9, in an exemplary embodiment, the display panel (PNL) includes the first flat area DA1 and the bending area BA. In the exemplary embodiment described with reference to FIGS. 8 and 9, a second flat area is not included in the display panel (PNL).

The first support plate 200 is coupled to one side of the panel support portion (PNL-SU). The first support plate 200 supports the first flat area DA1 of the display panel (PNL).

Accordingly, when the panel support portion (PNL-SU) is bent, the first flat area DA1 of the display panel (PNL) remains flat, and the bending area BA is curved.

Hereinafter, a display device according to an exemplary embodiment of the inventive concept will be described with reference to FIGS. 10 to 12. For convenience of explanation, a further description of components previously described may be omitted.

Figure 10:
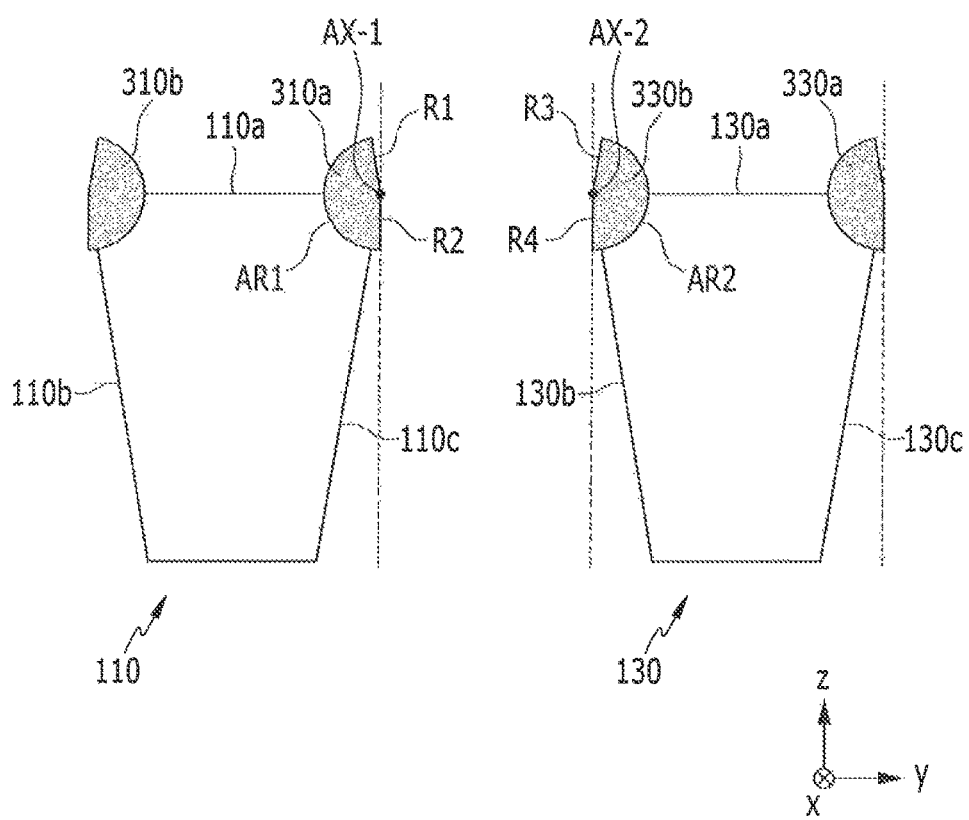
FIG. 10 illustrates a relationship of a first joint member and a second joint member of a display device according to an exemplary embodiment of the inventive concept.
Figure 11:
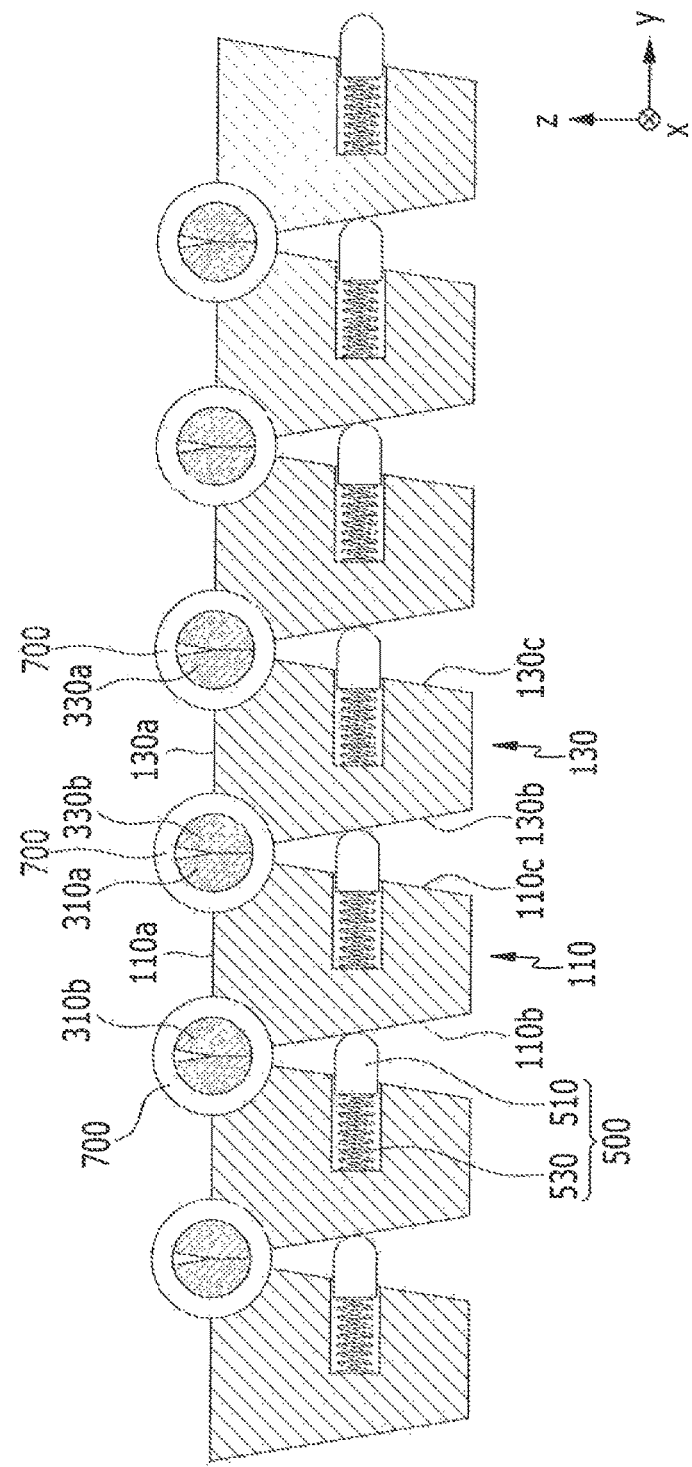
FIG. 11 illustrates a schematic view of an unfolded state of a panel support portion according to an exemplary embodiment of the inventive concept.

FIG. 10 illustrates a relationship of a first joint member and a second joint member of a display device according to an exemplary embodiment of the inventive concept, FIG. 11 illustrates a schematic view of an unfolded state of a panel support portion according to an exemplary embodiment of the inventive concept. FIG. 12 illustrates a schematic view of a bent state of the panel support portion of FIG. 11 according to an exemplary embodiment of the inventive concept.

Referring to FIG. 10, in an exemplary embodiment, the first rotational angle limiting member 310*a* is disposed at the first rotation axis AX-1 of the first joint member 110. The first rotational angle limiting member 310*a* has the fan shape including the first radius portion R1, the second radius portion R2, and the first arc portion AR1. The first arc portion AR1 corresponds to an arc of the fan shape.

In an exemplary embodiment, the first radius portion R1 and the first surface 110*a* form an acute angle, and the second radius portion R2 extends substantially perpendicular to the first surface 110*a*. The first arc portion AR1 is convex toward the second surface 110*b*. For example, the first arc portion AR1 of the first rotational angle limiting member 310*a* is not convex toward the second rotational angle limiting member 330*b* facing the first rotational angle limiting member 310*a*, but rather, is convex toward the second surface 110*b* of the first joint member 110. The first rotation axis AX-1 is located at a portion where the first radius portion R1 and the second radius portion R2 meet (e.g., the first rotation axis AX-1 passes through this point).

In an exemplary embodiment, the second rotational angle limiting member 330*b* is disposed at the second rotation axis AX-2 of the second joint member 130. The second rotational angle limiting member 330*b* has the fan shape including the third radius portion R3, the fourth radius portion R4, and the second arc portion AR2. The second arc portion AR2 corresponds to an arc of the fan shape.

In an exemplary embodiment, the third radius portion R3 and the fourth surface 130*a* form an acute angle, and the fourth radius portion R4 extends substantially perpendicular to the fourth surface 130*a*. The second arc portion AR2 is convex toward the sixth surface 130*c*. For example, the second arc portion AR2 of the second rotational angle limiting member 330*b* is not convex toward the first rotational angle limiting member 310*a* facing the second rotational angle limiting member 330*b*, but rather, is convex toward the sixth surface 130*c* of the second joint member 130. The second rotation axis AX-2 is located at a portion where the third radius portion R3 and the fourth radius portion R4 meet (e.g., the second rotation axis AX-2 passes through this point).

In an exemplary embodiment, the third radius portion R3 of the second rotational angle limiting member 330*b* faces the first radius portion R1 of the first rotational angle limiting member 310*a*, and the fourth radius portion R4 of the second rotational angle limiting member 330*b* faces the second radius portion R2 of the first rotational angle limiting member 310*a*.

Referring to FIG. 11, in an exemplary embodiment, the connecting member 700 is coupled to the first rotational angle limiting member 310*a* and the second rotational angle limiting member 330*b*. In an exemplary embodiment, the connecting member 700 has a ring shape. The first arc portion AR1 (refer to FIG. 10) of the first rotational angle limiting member 310*a* and the second arc portion AR2 (refer to FIG. 10) of the second rotational angle limiting member 330*b*, which respectively have the fan shape, contact an inner circumferential surface of the connecting member 700 having the ring shape. For example, in an exemplary embodiment, the connecting member 700 surrounds the first rotational angle limiting member 310*a* and the second rotational angle limiting member 330*b*.

The first arc portion AR1 of the first rotational angle limiting member 310*a*, which contacts a portion of the inner circumferential surface of the connecting member 700, may rotate about the first rotation axis AX-1 (refer to FIG. 10). The second arc portion AR2 of the second rotational angle limiting member 330*b*, which contacts another portion of the inner circumferential surface of the connecting member 700, may rotate about the second rotation axis AX-2 (refer to FIG. 10).

In an exemplary embodiment, since the first rotation axis AX-1 and the second rotation axis AX-2 overlap each other, the first arc portion AR1 of the first rotational angle limiting member 310*a* and the second arc portion AR2 of the second rotational angle limiting member 330*b* may rotate about the same rotation axis AX-1 and AX-2 along the inner circumferential surface of the ring-shaped connecting member 700.

In an exemplary embodiment, the second radius portion 12 (refer to FIG. 10) of the first rotational angle limiting member 310*a* and the fourth radius portion R4 (refer to FIG. 10) of the second rotational angle limiting member 330*b* face each other, and the second radius portion R2 and the fourth radius portion R4 are respectively substantially perpendicular to the first surface 110*a* (refer to FIG. 10) and the fourth surface 130*a* (refer to FIG. 10). As a result, according to exemplary embodiments, the rotational directions of the first rotational angle limiting member 310*a* and second rotational angle limiting member 330*b* (e.g., the rotational angles thereof) are limited.

Referring to FIG. 11, in an exemplary embodiment, because of the presence of the fourth radius portion R4 of the second rotational angle limiting member 330*b*, the second radius portion R2 of the first rotational angle limiting member 310*a* is prevented from rotating in a counterclockwise direction about the x-axis. For example, as shown in FIG. 10, in an exemplary embodiment, the second radius portion R2 of the first rotational angle limiting member 310*a* may rotate in a clockwise direction about the x-axis, but does not rotate in the counterclockwise direction.

Similarly, in an exemplary embodiment, because of the presence of the second radius portion R2 of the first rotational angle limiting member 310a, the fourth radius portion R4 of the second rotational angle limiting member 330b is prevented from rotating in the clockwise direction about the x-axis. For example, as shown in FIG. 10, in an exemplary embodiment, the fourth radius portion. R4 of the second rotational angle limiting member 330b may rotate in the counterclockwise direction about the x-axis, but does not rotate in the clockwise direction.

Referring to FIG. 11, the first joint member 110 may rotate in the clockwise direction about the first rotation axis AX-1 via the first rotational angle limiting member 310a and the second rotational angle limiting member 330b. The second joint member 130 may rotate in the counterclockwise direction about the first rotation axis AX-1 via the first rotational angle limiting member 310a and the second rotational angle limiting member 330b.

Figure 12:
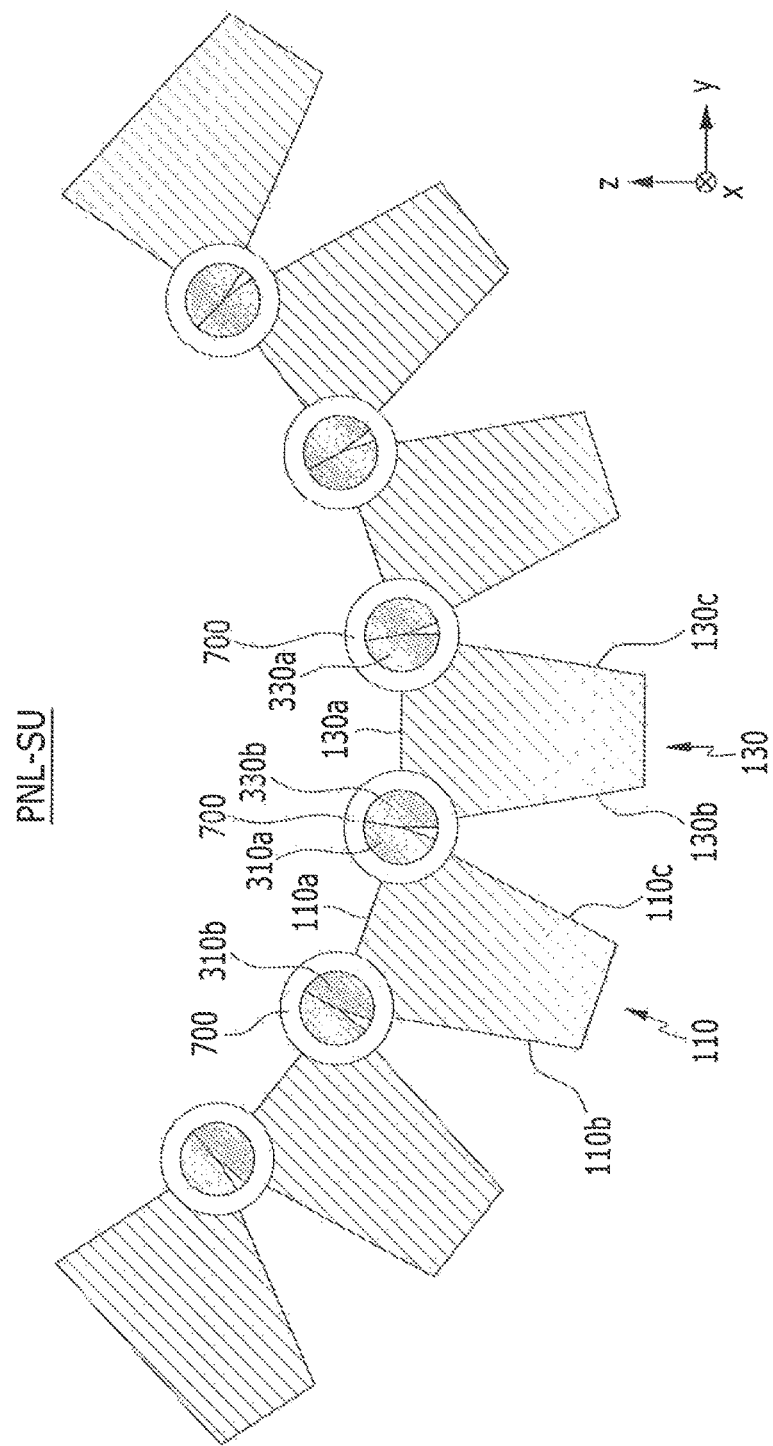
FIG. 12 illustrates a schematic view of a bent state of the panel support portion of FIG. 11 according to an exemplary embodiment of the inventive concept.

For example, as shown in FIG. 12, in an exemplary embodiment, the first surface 110a of the first joint member 110 and the fourth surface 130a of the second joint member 130 are disposed to have a shape that is convexly bent along the z-axis. As a result of the shape of the first rotational angle limiting member 310a of the first joint member 110 and the shape of the second rotational angle limiting member 330b of the second joint member 130, the display panel (PNL) disposed on the panel support portion (PNL-SU) may be convexly bent along the z-axis in only one direction according to exemplary embodiments.

According to exemplary embodiments of the inventive concept, a panel support portion (PNL-SU) of a display device includes a plurality of joint members 110 and 130 configured such that the display panel (PNL) only convexly bends in one direction.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A display device, comprising:
a display panel comprising a bending area that is bendable along an axis extending in a first direction; and
a panel support portion that supports the display panel in the bending area,
wherein the panel support portion comprises:
a plurality of joint members that support the display panel, wherein the joint members are sequentially arranged, and each joint member is rotatable about two rotation axes;
a plurality of rotational angle limiting members coupled to the plurality of joint members, wherein the rotational angle limiting members limit rotational angles of the joint members; and
a plurality of connecting members, wherein each connecting member is coupled to a pair of the rotational angle limiting members disposed at a pair of adjacent joint members, wherein the rotational angle limiting members included in the pair of the rotational angle limiting members directly contact each other and are fixed to an inner portion of the corresponding connecting member.

2. The display device of claim 1, wherein
the pair of adjacent joint members comprises a first joint member and a second joint member, and
the first joint member comprises:
a first surface facing the display panel; and
a second surface and a third surface that respectively contact opposite end portions of the first surface and face each other along the first direction,
wherein the first surface and the second surface form a first angle, the first surface and the third surface form a second angle, and each of the first angle and the second angle is an acute angle.

3. The display device of claim 2, wherein
the first angle and the second angle are about equal to each other.

4. The display device of claim 2, wherein
the second joint member comprises:
a fourth surface facing the display panel; and
a fifth surface and a sixth surface that respectively contact opposite end portions of the fourth surface and face each other along the first direction,
wherein the fifth surface faces the third surface of the first joint member,
the fourth surface and the fifth surface form a third angle and the fourth surface and the sixth surface form a fourth angle, and
each of the third angle and the fourth angle is an acute angle.

5. The display device of claim 4, wherein
the third angle and the fourth angle are about equal to each other.

6. The display device of claim 4, wherein
the plurality of rotational angle limiting members comprises a first rotational angle limiting member and a second rotational angle limiting member respectively coupled to one end portion of each of the first joint member and the second joint member,
the first rotational angle limiting member is disposed at a first rotation axis located at a portion where the first surface and the third surface meet, and
the second rotational angle limiting member is disposed at a second rotation axis located at a portion where the fourth surface and the fifth surface meet.

7. The display device of claim 6, wherein
each of cross-sections of the first rotational angle limiting member and the second rotational angle limiting member that are substantially perpendicular to the first direction has a fan shape comprising an arc portion, a first radius portion connected to a first end of the arc portion, and a second radius portion connected to a second end of the arc portion and the first radius portion.

8. The display device of claim 7, wherein
the first radius portion of the first rotational angle limiting member extends substantially perpendicular to the first surface,
the second radius portion of the first rotational angle limiting member extends substantially in a same direction as the third surface, and
the arc portion of the first rotational angle limiting member is convex toward the second surface.

9. The display device of claim 8, wherein
the first rotation axis is located at a portion where the first radius portion and the second radius portion of the first rotational angle limiting member meet.

10. The display device of claim 9, wherein
the first radius portion of the second rotational angle limiting member faces the first radius portion of the first rotational angle limiting member, and the second radius portion of the second rotational angle limiting member faces the second radius portion of the first rotational angle limiting member.

11. The display device of claim 10, wherein
the first radius portion of the second rotational angle limiting member extends substantially perpendicular to the fourth surface,
the second radius portion of the second rotational angle limiting member extends substantially in a same direction as the fifth surface, and
the arc portion of the second rotational angle limiting member is convex toward the sixth surface.

12. The display device of claim 11, wherein
the second rotation axis is located at a portion where the first radius portion of the second rotational angle limiting member and the second radius portion of the second rotational angle limiting member meet.

13. The display device of claim 11, wherein
the first rotation axis and the second rotation axis overlap each other.

14. The display device of claim 13, wherein
each of the plurality of connecting members has a ring shape.

15. The display device of claim 14, wherein
an inner circumferential surface of one of the connecting members contacts the arc portion of the first rotational angle limiting member and the arc portion of the second rotational angle limiting member.

16. The display device of claim 7, wherein
the first radius portion of the first rotational angle limiting member and the first surface form an acute angle,
the second radius portion of the first rotational angle limiting member extends substantially perpendicular to the first surface, and
the arc portion of the first rotational angle limiting member is convex toward the second surface.

17. The display device of claim 16, wherein
the first rotation axis is located at a portion where the first radius portion of the first rotational angle limiting member and the second radius portion of the first rotational angle limiting member meet.

18. The display device of claim 17, wherein
the first radius portion of the second rotational angle limiting member faces the first radius portion of the first rotational angle limiting member, and
the second radius portion of the second rotational angle limiting member faces the second radius portion of the first rotational angle limiting member.

19. The display device of claim 18, wherein
the first radius portion of the second rotational angle limiting member and the fourth surface form an acute angle,
the second radius portion of the second rotational angle limiting member extends substantially perpendicular to the fourth surface, and
the arc portion of the second rotational angle limiting member is convex toward the sixth surface.

20. The display device of claim 19, wherein
the second rotation axis is located at a portion where the first radius portion of the second rotational angle limiting member and the second radius portion of the second rotational angle limiting member meet.

21. A display device, comprising:
a display panel comprising a bending area that is bendable along an axis extending in a first direction; and
a pane support portion that supports the display panel in the bending area,
wherein the panel support portion comprises:
a plurality of joint members that support the display panel, wherein the joint members are sequentially arranged, and each joint member is rotatable about two rotation axes;
a plurality of rotational angle limiting members coupled to the plurality of joint members, wherein the rotational angle limiting members limit rotational angles of the joint members; and
a plurality of connecting member, wherein each connecting member is coupled to a pair of the rotational angle limiting members disposed at a pair of adjacent joint members, wherein the rotational angle limiting members included in the pair of the rotational angle limiting members contact each other and are fixed to an inner portion of the corresponding connecting member,
wherein
the pair of adjacent joint members comprises a first joint member and a second joint member, and
the first joint member comprises:
a first surface facing the display panel; and
a second surface and a third surface that respectively contact opposite end portions of the first surface and face each other along the first direction,
wherein the first surface and the second surface form a first angle, the first surface and the third surface form a second angle, and each of the first angle and the second angle is an acute angle,
wherein
the second joint member comprises:
a fourth surface facing the display panel; and
a fifth surface and a sixth surface that respectively contact opposite end portions of the fourth surface and face each other along the first direction,
wherein the fifth surface faces the third surface of the first joint member,
the fourth surface and the fifth surface form a third angle and the fourth surface and the sixth surface form a fourth angle, and
each of the third angle and the fourth angle is an acute angle,
wherein the display device further comprises a spacer disposed in the third surface of the first joint member, wherein the spacer presses against the fifth surface of the second joint member.

22. The display device of claim 21, wherein
the spacer comprises an elastic member disposed in a groove formed in the third surface.

23. The display device of claim 22, wherein
the spacer comprises a protrusion member coupled to an end portion of the elastic member.

24. The display device of claim 21, further comprising:
a plurality of spacers including the spacer.

25. The display device of claim 21, further comprising:
a first support plate coupled to a first side of the panel support portion,
wherein the display panel comprises a first flat area disposed at a first side of the bending area, and the first support plate supports the display panel in the first flat area.

26. The display device of claim 25, further comprising:
a second support plate coupled to a second side of the panel support portion opposite the first side of the panel support portion,
wherein the display panel comprises a second flat area disposed at a second side of the bending area opposite the first side of the bending area, and the second support plate supports the display panel in the second flat area.

27. A display device, comprising:
a display panel comprising a bending area; and
a panel support portion that supports the display panel in the bending area,
wherein the panel support portion comprises:
a first joint member and a second joint member that support the display panel, wherein each of the first and second joint members is rotatable about two rotation axes;
a first fan-shaped rotational angle limiting member coupled to a first end portion of the first joint member;
a second fan-shaped rotational angle limiting member coupled to a first end portion of the second joint member, wherein the first end portion of the first joint member is adjacent to the first end portion of the second joint member,
wherein each of cross-sections of the first fan-shaped rotational angle limiting member and the second fan-shaped rotational angle limiting member comprises an arc portion, a first radius portion connected to a first end of the arc portion, and a second radius portion connected to a second end of the arc portion and the first radius portion; and
a first connecting member coupled to the first fan-shaped rotational angle limiting member and the second fan-shaped rotational angle limiting member, wherein the first and second fan-shaped rotational angle limiting members contact each other and are fixed to an inner portion of the first connecting member,
wherein the inner portion of the first connecting member surrounds the first fan-shaped rotational angle limiting member and the second fan-shaped rotational angle limiting member.

28. The display device of claim 27, wherein the panel support portion further comprises:
a third fan-shaped rotational angle limiting member coupled to a second end portion of the first joint member,
wherein the first end portion of the first joint member is opposite the second end portion of the first joint member;
a fourth fan-shaped rotational angle limiting member coupled to a second end portion of the second joint member,
wherein the first end portion of the second joint member is opposite the second end portion of the second joint member, and the second end portion of the first joint member is adjacent to the second end portion of the second joint member; and
a second connecting member coupled to the third fan-shaped rotational angle limiting member and the fourth fan-shaped rotational angle limiting member, wherein the third and fourth fan-shaped rotational angle limiting members contact each other and are fixed to an inner portion of the second connecting member.

* * * * *